United States Patent [19]
Cameron et al.

[11] Patent Number: 5,631,803
[45] Date of Patent: May 20, 1997

[54] EROSION RESISTANT ELECTROSTATIC CHUCK WITH IMPROVED COOLING SYSTEM

[75] Inventors: John F. Cameron, Los Altos, Calif.; Joseph F. Salfelder, Williston, Vt.; Chandra Deshpandey, Fremont, Calif.

[73] Assignee: Applied Materials, Inc., Santa Clara, Calif.

[21] Appl. No.: 369,237

[22] Filed: Jan. 6, 1995

[51] Int. Cl.$^6$ .................................................. H02N 13/00
[52] U.S. Cl. ........................................................ 361/234
[58] Field of Search ............................. 361/234; 279/128

[56] References Cited

U.S. PATENT DOCUMENTS

| | | |
|---|---|---|
| 4,184,188 | 1/1980 | Briglia . |
| 4,384,918 | 5/1983 | Abe . |
| 4,399,016 | 8/1983 | Tsukada et al. . |
| 4,771,730 | 9/1988 | Tezuka . |
| 5,275,683 | 1/1994 | Arami et al. ............... 156/345 |
| 5,530,616 | 6/1996 | Kitabayashi et al. ......... 361/234 |

FOREIGN PATENT DOCUMENTS

| | | | |
|---|---|---|---|
| 0452222 | 10/1991 | European Pat. Off. | ............... 361/234 |
| 1-298721 | 12/1989 | Japan . | |
| 2-27748 | 1/1990 | Japan . | |

OTHER PUBLICATIONS

U.S. application No. 08/052,018, filed Apr. 22, 1993.
U.S. application No. 08/199,402, filed Feb. 22, 1994.
U.S. application No. 08/199,916, filed Apr. 22, 1994.
U.S. application No. 08/278,787, filed Jul. 19, 1994.
U.S. application No. 08/369,237, filed Jan. 6, 1995.
Klein, Allen J., "Curing Techniques for Composites," *Advanced Composites*, Mar./Apr. 1988, pp. 32–44.
"Data Sheet—Breathers and Bleeders," Data Sheet form Airtech International, Inc., Carson, California (1993).
"Kapton General Information," Technical Brochure from DuPont de Nemours Company, Wilmington, Delaware (1993).
"R/flex® 1100 High Temperature Materials," Data Sheet DS20903D, Rogers Corporation, Chandler, Arizona (1993).
Daviet, J.F., et al., "Electrostatic Clamping Applied to Semiconductor Plasma Processing. I. Theoretical Modeling," *J. Electrochem. Soc.*, 140(11):3245–3255 (Nov. 1993).
Daviet, J.F., et al., "Electrostatic Clamping Applied to Semiconductor Plasma Process. II. Experimental Results," *J. Electrochem. Soc.*, 140(11):3256–3261 (Nov. 1993).
Steger, R.J., "Heat Transfer in Gas Cooled Pedestals," (Apr. 5, 1991).
Wright, D.R. et al., "Low Temperature Etch Chuck: Modeling and Experimental Results of Heat Transfer and Wafer Temperature," *J. Vac. Sci. Technol.*, 10(4):1065–1070 (Jul./Aug. 1992).
U.S. Patent Application entitled, "An Electrostatic Chuck Having a Grooved Surface," by Roger J. Steger, filed Jul. 20, 1993 (Applied Materials Docket 260).

*Primary Examiner*—Fritz Fleming
*Attorney, Agent, or Firm*—Ashok K. Janah; Peter J. Sgarbossa

[57] ABSTRACT

An electrostatic chuck (20) for holding a substrate (40) in a process chamber (50) comprises a base (25) supporting a resilient insulator (30). The insulator (30) comprises (i) an electrode (35) embedded therein; (ii) a top surface (34) with a peripheral edge (32); and (iii) cooling grooves (45) for holding coolant in the top surface (34), the tips (125) of the cooling grooves (45) and the peripheral edge (32) of the insulator (30) defining an edge gap (130) having a width w. The width w of the edge gap (130) is sized sufficiently small that the coolant in the grooves (45) cools the perimeter (120) of the substrate (40) held on the chuck (20). The insulator (30) is sufficiently thick that when a substrate (40) is electrostatically held on the chuck (20) and coolant is held in the cooling grooves (45), the insulator (30) in the edge gap (130) resiliently conforms to the substrate (40) so that substantially no coolant leaks out from the tips (125) of the cooling grooves (45). Preferably, the coolant grooves (45) do not cut into the electrode (35).

26 Claims, 5 Drawing Sheets

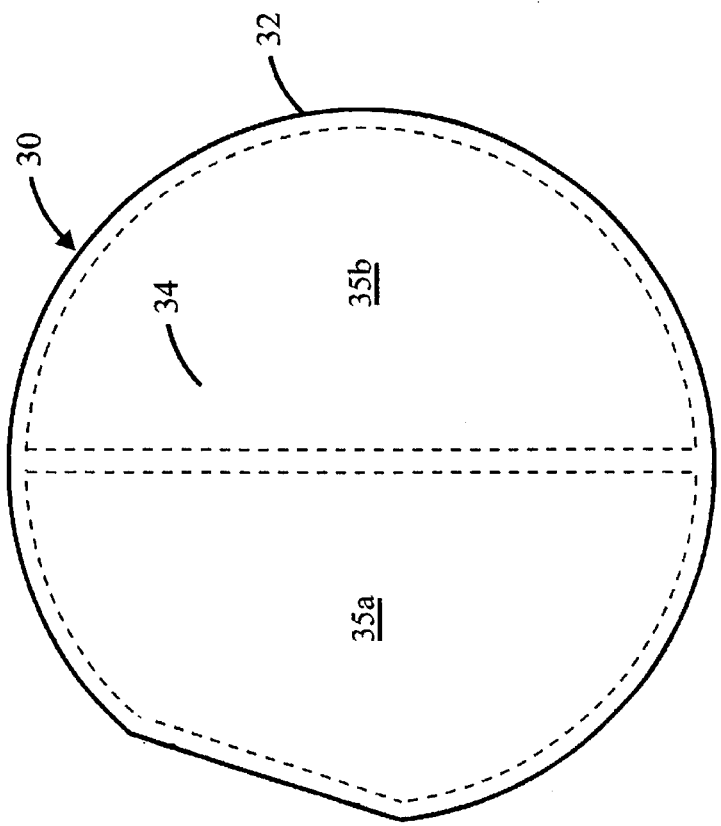
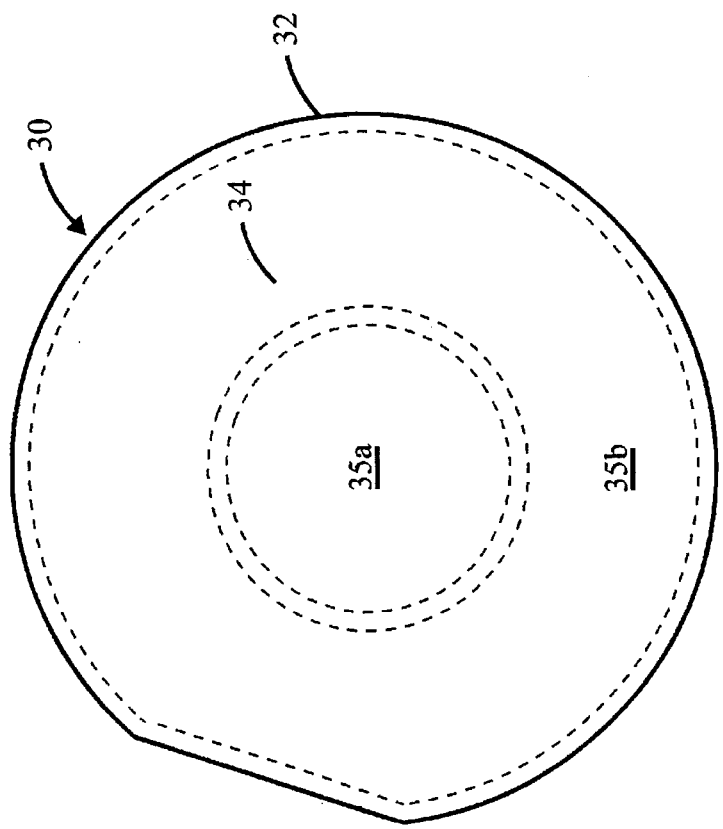

EROSION RESISTANT ELECTROSTATIC CHUCK WITH IMPROVED COOLING SYSTEM

BACKGROUND

The present invention is directed to electrostatic chucks for holding and positioning semiconductor substrates within process chambers during substrate processing operations.

Electrostatic chucks are used in semiconductor fabrication processes to hold substrates during processing of the substrates. A typical electrostatic chuck comprises a base adapted to be secured to a support in a process chamber. An insulator with an electrode embedded therein, is on the base. Typically, the insulator is an insulative polymer such as a polyimide, and the electrode is an electrically conductive metal layer. An electrical connector electrically connects the electrode in the insulator to a voltage supply source in the process chamber. When a substrate is placed on the chuck, and the voltage supply used to electrically bias the electrode in the insulator, opposing electrostatic charge accumulates in the substrate and the electrode resulting in attractive electrostatic forces that hold the substrate to the chuck. Electrostatic chucks are generally described in, for example U.S. patent application Ser. Nos. 08/278,787 by Cameron, et al.; 08/276,735 by Shamouilian, et al.; and 08/189,562, by Shamouilian, et al.—all of which are incorporated herein by reference.

Conventional electrostatic chucks also have cooling systems for cooling the substrate held on the chuck. However, conventional cooling systems do not adequately cool the perimeter of the substrate because the cooling systems stop short of, and do not extend to, the peripheral edge of the chuck. For example, U.S. patent application Ser. Nos. 08/276,735 and 08/189,562, both by Shamouilian, et al., describe a coolant system comprising coolant grooves which extend through the insulator and electrode on the chuck, and hold a coolant for cooling the substrate. When a substrate is held on the chuck, the substrate covers and seals the coolant grooves so that the coolant held in the grooves does not leak out. The coolant grooves stop short of the peripheral edge of the insulator, forming a relatively large edge gap between the grooves and the peripheral edge of the insulator, the edge gap often exceeding 10 to 20 mm. The large edge gap is provided to allow the overlying substrate to effectively cover and seal the coolant grooves so that coolant does not leak out from the grooves. However, because no coolant is held in the edge gap, the overlying perimeter of the substrate may be less effectively cooled compared to central portions of the substrate. Thus a risk of overheating which can damage the integrated circuits processed on the substrate and reduce effective yields from the substrate may exist in these chucks.

Another limitation of conventional chucks is the weak electrostatic attractive force that is obtained from electrodes having reduced surface areas. The area of the electrode in conventional chucks is often reduced by features which extend and cut through the electrode, such as for example, the coolant grooves of the afore described chuck cooling system which cut through the electrode. The reduced electrode area lowers the electrostatic clamping force exerted by the electrode when the electrode is electrically biased. Weak electrostatic clamping force can result in movement or misalignment of the substrate during processing, which can result in loss of the entire substrate at a cost of several thousands of dollars. Weak clamping force can also cause coolant to leak out from the coolant grooves covered by the substrate.

Another problem of existing chucks is the limited lifetime of the chucks in erosive environments. The use of polymers, such as polyimide, to insulate the electrode of the electrostatic chuck limits the useful lifetime of the chuck in erosive semiconductor fabrication processes, particularly in processes which use oxygen or halogen containing gases and plasmas. Oxygen and halogen containing gases and plasmas are used for a variety of tasks, including etching of substrates and cleaning of process chambers. These gases form erosive environments which can rapidly erode the exposed polyimide portions of the insulator on the chuck. While a large portion of the insulator on the chuck is covered by the substrate held on the chuck and thereby protected from the erosive environment, the peripheral edge of the insulator is still exposed to the erosive environment. The exposed peripheral edge of the insulator can erode in as few as a thousand process cycles. Erosion even at a single point on the peripheral edge of the insulator can expose the electrode in the chuck, causing failure of the chuck by short circuiting of the electrode. Failure of the insulated electrode requires replacement of the entire chuck which is expensive and slows down the fabrication process. Therefore, it is desirable to have an electrostatic chuck that demonstrates reduced erosion.

Thus it is desirable to have an electrostatic chuck which provides improved cooling for the substrate held on the chuck. It is also desirable for the chuck to have increased electrostatic clamping force for holding the substrate on the chuck. It is further desirable to have a chuck with improved erosion resistance.

SUMMARY

The electrostatic chuck of the present invention satisfies these needs, and is suitable for holding a substrate in a process chamber. The electrostatic chuck comprises a base supporting a resilient insulator. The insulator comprises (i) an electrode embedded therein, (ii) a top surface with a peripheral edge, and (iii) cooling grooves for holding coolant in the top surface, the tips of the cooling grooves defining an edge gap with the peripheral edge of the insulator. The edge gap has a width w which is sized sufficiently small that the coolant in the grooves cools the perimeter of the substrate held on the chuck. The insulator is sufficiently thick that when a substrate is electrostatically held on the chuck and coolant is held in the cooling grooves, the insulator in the edge gap resiliently conforms to the substrate so that substantially no coolant leaks out from the tips of the cooling grooves. Preferably, the edge gap is sufficiently small that the coolant in the groove maintains the temperatures at the perimeter of the substrate less than about 100° C., and more preferably less than about 80° C.

Preferably, the insulator is fabricated as (i) a lower insulative layer having an electrode embedded therein on the base, and (ii) an upper insulative layer with the cooling grooves therein. Preferably, the cooling grooves in the upper insulative layer extend through substantially the entire upper layer without cutting through the electrode. This allows the electrode to cover substantially the entire area of the insulator thereby providing enhanced electrostatic clamping force.

DRAWINGS

These and other features, aspects, and advantages of the present invention will become better understood with regard to the following description, appended claims, and accompanying drawings which provide illustrative examples of the invention, where:

FIG. 4 is a top plan view of a partially fabricated insulator with a bipolar electrode therein; and FIG. 5 is a top plan view of a partially fabricated insulator with another version of a bipolar electrode therein.

DESCRIPTION

Figure 1A:
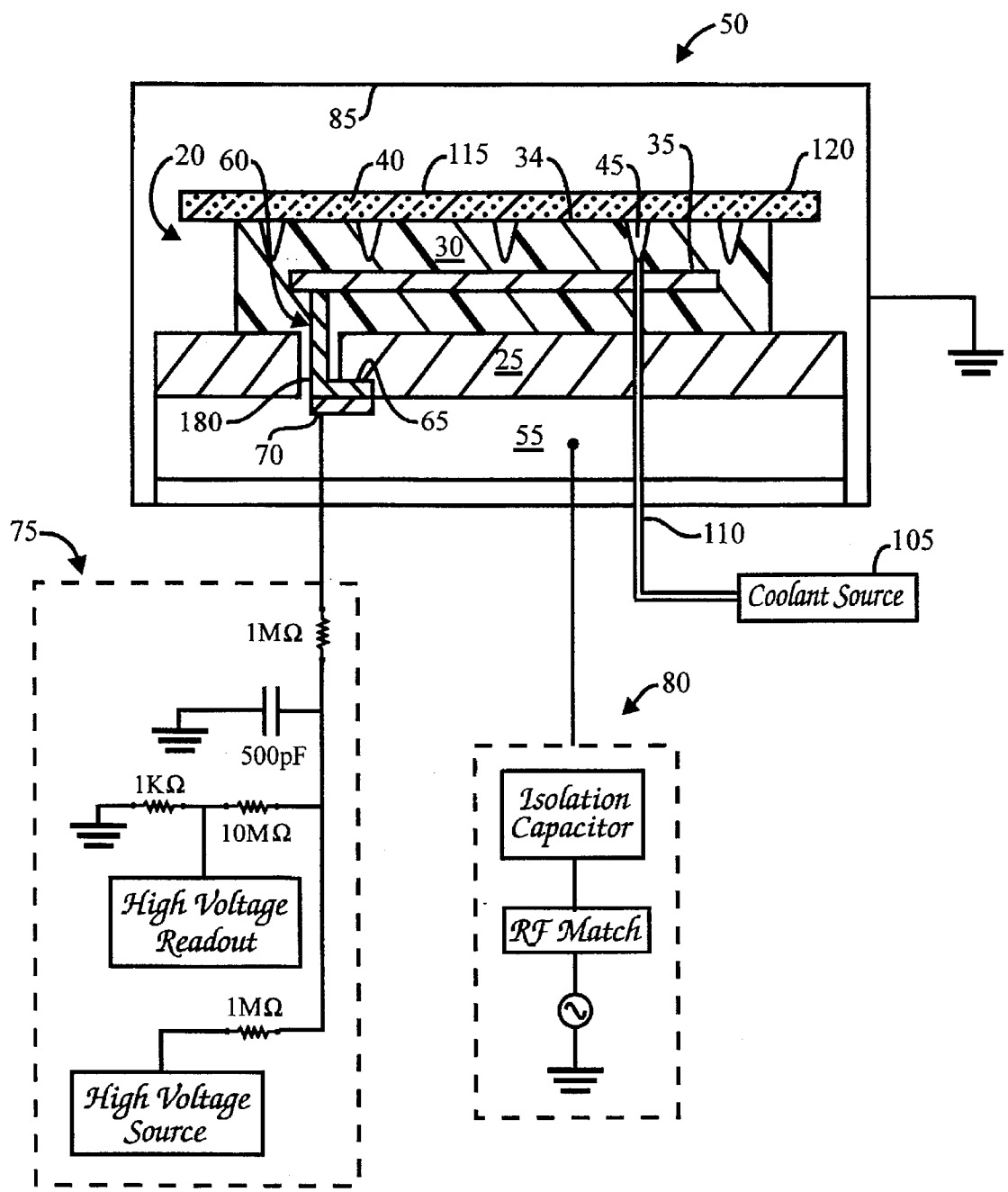
FIG. 1a is a partial cross-sectional, side elevational schematic view of a process chamber showing operation of a monopolar electrode version of the electrostatic chuck of an present invention.
Figure 1B:
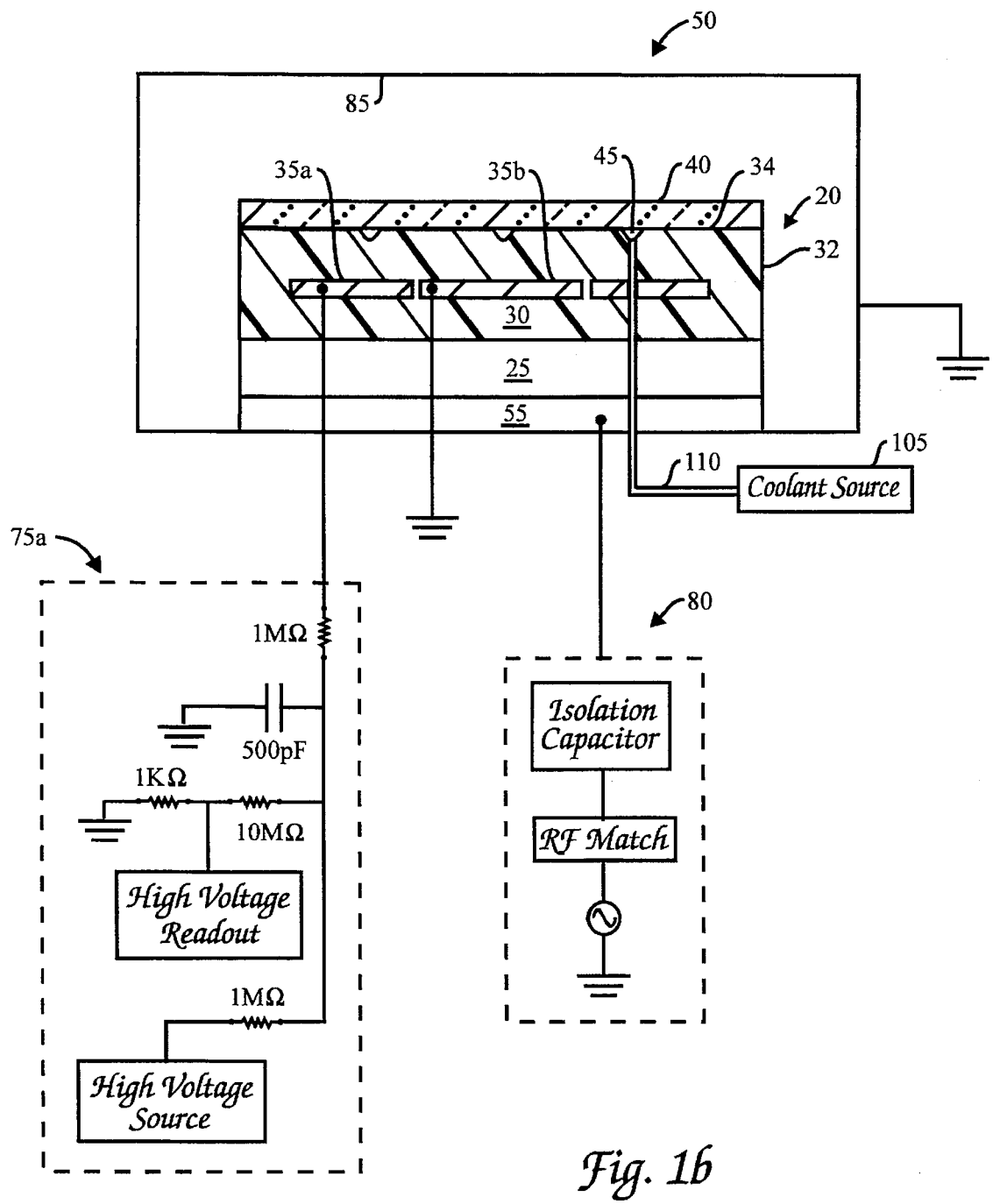
FIG. 1b is a partial cross-sectional, side elevational schematic view of a process chamber showing operation of a bipolar electrode version of an electrostatic chuck of the present invention.
Figure 2:
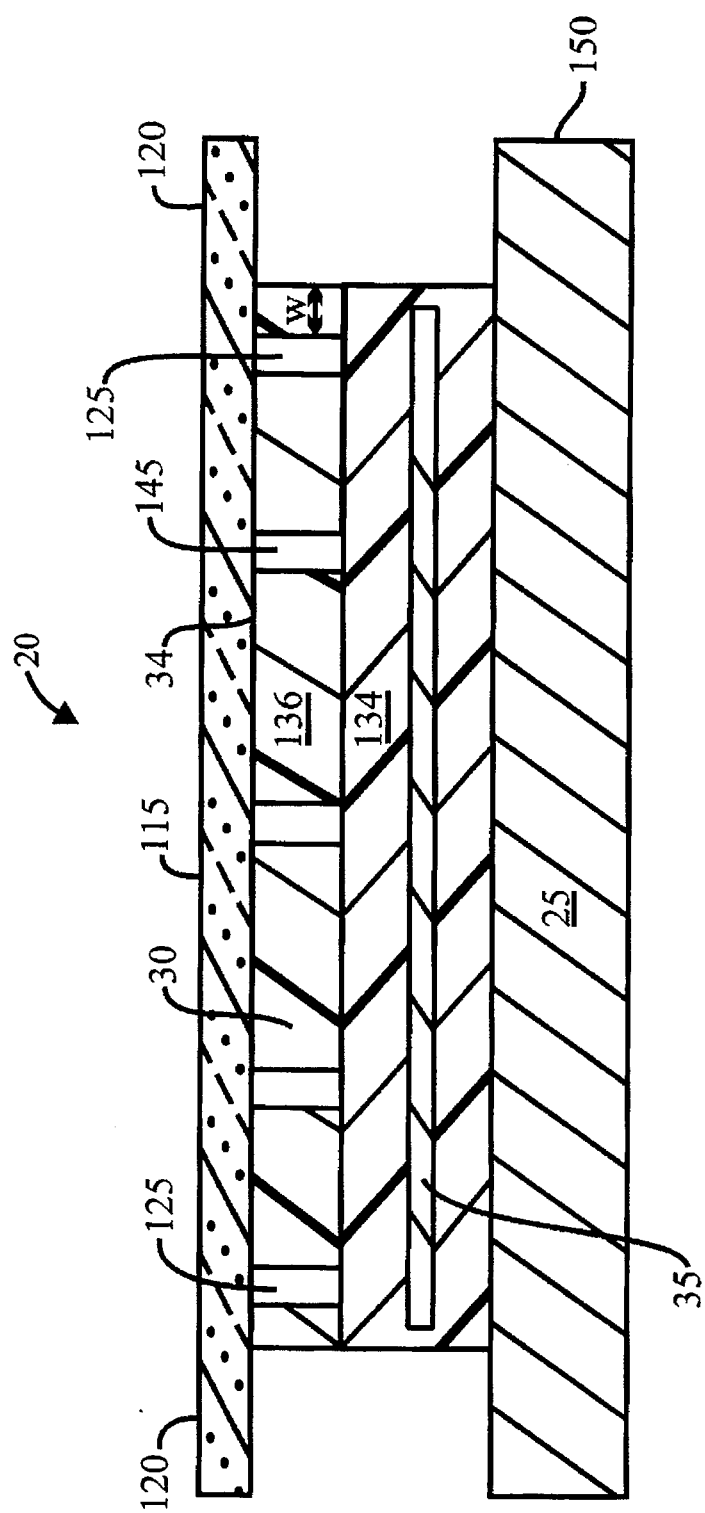
FIG. 2 is a cross-sectional, side elevational schematic view of a chuck of the present invention, showing a multi-layer insulator of the present invention around the chuck.

With reference to FIGS. 1a, 1b, and 2, the electrostatic chuck 20 of the present invention generally comprises a base 25 with an insulator 30 supported on the base 25. The insulator 30 has a peripheral edge 32 and a top surface 34. The top surface 34 of the insulator 30 is adapted to support a substrate 40 thereon, and has grooves 45 therein for holding a coolant for cooling the substrate 40. The insulator 30 also has an electrode 35 enclosed therein. The electrode 35 can be a single monopolar electrode 35 as shown in FIG. 1a, or two or more bipolar electrodes 35a, 35b as shown in FIG. 1b.

With reference to FIG. 1a, operation of a monopolar chuck 20 having a single electrode 35 will now be described. FIG. 1a shows a typical process chamber 50 for processing a substrate 40, such as a silicon wafer. The particular embodiment of the process chamber 50 shown herein is suitable for plasma processing of substrates, and is provided only to illustrate operation of the chuck 20, and should not be used to limit the scope of the invention. The process chamber 50 typically includes a support 55. During its use, the electrostatic chuck 20 is positioned on the support 55. An electrical connector 60 with an electrical contact 65 electrically connects the electrode 35 in the chuck 20 to a terminal 70 on the support 55 in the process chamber 50. A first voltage supply 75 is connected to the terminal 70 on the support 55, and provides a voltage to the electrode 35 for operating the chuck 20. The first voltage supply 75 comprises a high voltage DC source of about 1000 to 3000 volts, connected to a high voltage readout, through a 10 MΩ resistor. A 1 MΩ resistor is provided in the circuit to limit the current flowing through the circuit, and a 500 pF capacitor is provided as an alternating current filter.

A second voltage supply 80 is connected to the support 55 in the process chamber 50. At least a portion of the support 55 is electrically conductive, typically aluminum, and functions as a process electrode 35 for forming a plasma in the chamber 50. The second voltage supply 80 electrically biases the support 55 with respect to an electrically grounded surface 85 in the chamber 50. The second voltage supply 80 is conventional and generally comprises an RF impedance that matches the impedance of the process chamber 50 to the impedance of the line voltage, in series with an isolation capacitor, as shown in FIG. 1a.

During operation of the chuck, a process gas is introduced in the process chamber 50, and the second voltage supply 80 is activated to electrically bias the support 55 with respect to the grounded surface 85 in the process chamber 50, thereby forming a plasma from the process gas introduced in the process chamber 50. A substrate 40 is placed on the chuck 20, and the electrode 35 is electrically biased with respect to the substrate 40 by the first voltage supply 75. The electrically charged plasma species in the chamber 50 impinge on the substrate 40 causing opposing electrostatic charge to accumulate in the substrate 40 and electrode 35. The opposing electrostatic charge results in an attractive electrostatic force that attracts and holds the substrate 40 to the chuck 20.

Instead of a single monopolar electrode 35, the chuck 20 can also comprise two electrodes 35a, 35b capable of use as bipolar electrodes, illustrative examples of which are shown in FIGS. 5 and 6. Typically, the bipolar electrodes 35a, 35b are coplanar to one another, and each of the two electrodes 35a, 35b have substantially equivalent surface areas, as described below.

Referring now to FIG. 1b, operation of the bipolar electrode version of the chuck will be described. The voltage supply powering the bipolar electrodes can have several alternative configurations. For example, the voltage supply can comprise a single voltage source 75 connected to one of the electrodes 35a, with the other electrode 35b being connected to ground (as shown). The two electrodes are maintained at opposing polarities which induce opposing electrostatic charges in the substrate 40. The opposing electrostatic charges attract one another and electrostatically hold the substrate 40 to the chuck 20 without use of a plasma to electrically bias the substrate 40. The bipolar electrode configuration is advantageous for nonplasma processes during which there are no charged plasma species to serve as charge carriers for electrically biasing the substrate 40. Alternatively, the voltage supply can comprise two voltage sources (not shown), each of the voltage sources being separately connected to one of the electrodes 35a, 35b. This configuration being useful for processes having non-plasma stages.

The cooling system of the chuck will now be described. Typically, the cooling grooves 45 on the top surface 34 of the insulator 30 of the chuck form a pattern of intersecting channels that extend radially or circumferentially across the top surface 34 of the insulator 30, a suitable pattern of grooves 45 being shown in FIG. 5. The grooves are patterned so that the coolant flowing through the grooves 45 can absorb heat from the substrate 40 to control the temperatures of the substrate 40. Referring to FIGS. 1a and 1b, a coolant source 105, such as a tank of compressed helium, is provided for supplying coolant to the cooling grooves 45 on the top surface 34 of the insulator 30. Typically, a supply line 110 runs from the coolant source 105 through the support 55 and the base 25 of the chuck 20 to the grooves 45 on the top surface 34 of the insulator 30. During processing of the substrate 40, the substrate 40 covers and seals the cooling grooves 45 so that coolant does not leak out from the grooves 45.

Referring now to FIG. 2, the substrate 40 has a center 115 and a perimeter 120. In order to effectively cool the perimeter 120 of the substrate 40, the tips 125 of the cooling grooves 45 are positioned sufficiently proximate to the peripheral edge 32 of the insulator 30 that the perimeter 120 of the substrate 40 is cooled by the coolant. The groove tips 125 and the peripheral edge 32 of the insulator 30 define an edge gap 130 having a width w that is sized sufficiently small that the coolant in the groove 45 maintains the temperatures at the perimeter 120 of the substrate 40, during processing of the substrate, less than about 100° C., and more preferably less than about 80° C. Preferably, the coolant in the tips of the grooves 45 maintains the temperatures at the perimeter 120 of the substrate 40 substantially equivalent to the temperatures at the center 115 of the substrate 40. By "substantially equivalent" it is meant that the average difference in temperature between the perimeter 120 and center 115 of the substrate is less than about 10° C., and more preferably less than about 7° C., and most preferably less than about 5° C. Most preferably the coolant maintains substantially the entire substrate 40 at constant temperatures. Preferably the edge gap 130 is sized less than about 7 mm, more preferably from about 1 mm to about 5 mm, and most preferably less than about 3 mm.

It has been discovered that in order to effectively seal the tips 125 of the cooling grooves 45 so that coolant does not escape from the grooves 45, the insulator 30 has to be sufficiently resilient and sufficiently thick that the peripheral edge 32 of the insulator 30 can conform to the substrate 40 electrostatically held on the chuck 20 and seal the grooves 45, so that no coolant leaks out from the tips 125 of the cooling grooves 45. Thus the insulator 30 preferably comprises an elastic or resilient material, such as a polymer. Suitable resilient polymers include polyimide, polyketone, polyetherketone, polysulfone, polycarbonate, polystyrene, nylon, polyvinylchloride, polypropylene, polyethersulfone, polyethylene terephthalate, fluoroethylene propylene copolymers, cellulose, triacetates, silicone, and rubber. When a polymer such as polyimide is used, the resilience of the polyimide, as measured by the tensile elastic modulus of the polyimide, is preferably from about 0.25 to about 10 GPa, and more preferably from about 1 to about 5 GPa.

In addition to being resilient, the insulator 30 should have a sufficient thickness to conform to the substrate 40 and seal the tips 125 of the cooling grooves 45 under the electrostatic clamping force applied by the substrate 40 held on the insulator 30. Thus preferably the insulator 30 comprises a multiple layer structure, as shown in FIG. 2, comprising a lower insulative layer 134 in which the electrode 35 is embedded, and an upper insulative layer 136. The multiple layer insulator is preferred because it allows forming a separate insulative layer, namely the upper insulative layer 136, above the lower insulative layer 134 containing the electrode 35. Because the electrode 35 in the lower insulative layer 134 is typically made of an inelastic metal, the lower insulative layer 134 containing the electrode 35 does not conform readily to the substrate 40. Providing additional thickness of insulator above the electrode 35 by placing the upper insulative layer 136 on the lower insulative layer 134 provides a resilient "cushion" that allows the insulator 30 to conform to the substrate 40 and seal the tips 125 of the grooves 45 even though the edge gap 130 between the groove tips 125 and the peripheral edge 32 of the insulator 30 is small. Moreover, the separable upper insulative layer 136 can comprise an elastic and soft layer which more readily conforms to the substrate 40, and more effectively seals the tips 125 of the grooves 45. The thickness of the upper insulative layer 136 of the insulator 30 in which the coolant grooves 45 are formed typically is from about 50 μm to about 100 μm. Preferably, the thickness of the upper insulative layer 136 is substantially equivalent to the thickness of the lower insulative layer 134. The lower insulative layer 134 can also comprise two separate insulative layers 134a, 134b enclosing the electrode 35 therebetween.

Preferably, the coolant grooves 45 do not cut through the electrode 35 or the electrodes 35a, 35b, and when the multiple layer insulator 30 is used, the grooves 45 preferably extend only thorough the upper insulative layer 136 of the insulator 30. Several important and unexpected advantages are obtained by not having the cooling grooves 45 cut through the electrodes. One advantage is that the physical size, layout and electrical isolation of the electrode 35 or electrodes 35a, 35b, can be more easily optimized. For example, because the cooling grooves 45 do not cut through the electrode 35, the electrode 35 can cover substantially the entire area of the insulator 30, providing a larger effective electrostatic area for the electrode 35 and greater electrostatic clamping force. In another example, certain electrode configurations, such as the afore described bipolar electrode configurations, are easier to position and layout in the insulator 30 without coolant grooves extending through the electrodes 35a, 35b. A further advantage relates to improved erosion resistance. When the cooling grooves 45 cut through the electrode 35, the insulator 35 around the portion of the electrode 35 which is adjacent to the cooling grooves 45 forms corners and edges that rapidly erode in erosive environments due to the inherent higher chemical "activity" of corner and edge sites. When the cooling grooves 45 do not cut through the electrode 35, there are fewer corner and edges in the insulator 30, thus, providing enhanced erosion resistance for the chuck 20.

Several features of the chuck 20 enhance the erosion resistance of the chuck 20 to provide a chuck 20 having a longer lifetime. For example, the electrical connector 60 of the chuck 20 can extend directly through the base 25, rather than around the edge of the base 25, to enhance the erosion resistance of the chuck 20. During processing, the substrate 40 covers the electrical connector 60 and reduces exposure of the insulator 30 on the connector 60 to the erosive process gases in the chamber 50, increasing its erosion resistance. Electrical connectors 60 are described in U.S. patent application Ser. No. 08/410,449, entitled "Electrostatic Chuck with Erosion-Resistant Electrode Connection," by Shamouilian, et al., which is incorporated herein by reference. Also described in the above application is a masking gas assembly that distributes a masking inert gas onto the peripheral edge 32 of the insulator 30 to reduce erosion of the insulator 30.

Particular aspects of the chuck 20 will now be discussed.

Base

The base 25 of the chuck 20 is provided for supporting the insulator 30 with the electrode 35 therein. Generally, the base 25 has a shape and size corresponding to the shape and size of the substrate 40 to maximize the heat transfer surface between the base 25 and the substrate 40. For example, if the substrate 40 is disk shaped, a right cylindrically shaped base 25 is preferred. Alternatively, the base 25 can have a shape different from the shape of the substrate 40, or a size different from the size of the substrate 40.

Typically, the base 25 has a central portion which receives the insulator 30, and a collar ledge 150 which extends beyond the insulator 30. The collar ledge 150 may be at a reduced height from the central portion of the base so that the base 25 resembles a pedestal (not shown). Preferably, the base 25 has a hole 180 therethrough, the hole 180 being sized sufficiently large to insert the electrical connector 60 therethrough, as shown in FIG. 1a.

Typically, the base 25 is machined from aluminum and has a right cylindrical shape, with a diameter of about 100 to 300 mm to match the diameter of the substrate 40 which typically ranges from about 127 to about 203 mm (5–8 inches), and a thickness of about 1.5 to 2 cm. The top and bottom surfaces of the aluminum plate are ground using conventional aluminum grinding techniques, until the surface roughness of the plate is less than about 1 micron. Surface grinding of the plate is essential for the base 25 to uniformly contact the support 55 and the substrate 40 placed on the base 25, to allow for efficient thermal transfer between the substrate 40, the base 25, and the support 55. After grinding, the plate is thoroughly cleaned to remove grinding debris.

Insulator with Grooved Upper Layer

The insulator 30 on the base 25 of the chuck 20 typically comprises a resilient polymeric insulator material, such as the previously described polymers. Preferably, the polymer is resistant to temperatures in excess of 50° C., and more preferably resistant to temperatures in excess of 100° C., so that the chuck 20 can be used for processes where the substrate 40 is heated. Also, preferably, the polymer has a high thermal conductivity so that heat generated in the substrate 40 during processing can dissipate through the chuck 20. The thermal conductivity of the insulator 30 should be at least about 0.10 Watts/m/°K., to allow sufficient heat transfer to preclude overheating of the substrate 40.

The insulator 30 can also include a high thermal conductivity filler material, such as diamond, alumina, zirconium boride, boron nitride, and aluminum nitride for increasing the thermal conductivity and resistance to plasma corrosion. Preferably, the filler material is a powder with an average particle size of less than about 10 μm. Typically, the filler is dispersed in the insulator material in a volumetric ratio from about 10% to 80%, and more typically from about 20% to 50%.

The insulator 30 is sized sufficiently large to enclose the electrode 35 therein, and preferably sized sufficiently thick that the grooves in the insulator 30 do not cut through the electrode 35. The overall thickness of the insulator 30 necessary to electrically insulate the electrode 35 varies according to the electrical resistivity and dielectric constant of the polymer used to form the insulator 30. Typically, the polymer has a resistivity ranging from about $10^{13}$ Ωcm to $10^{20}$ Ωcm, and a dielectric constant of at least about 2, and more preferably at least about 3. Thus when the polymer has a dielectric constant of about 3.5, the entire insulator 30 is typically about 10 μm to about 500 μm thick, and preferably from about 100 μm to about 300 μm thick. When a polyimide is used, the insulator 30 has a dielectric breakdown strength of at least about 100 volts/mil (3.9 volts/micron), and more typically at least about 1000 volts/mil (39 volts/micron).

Figure 3:
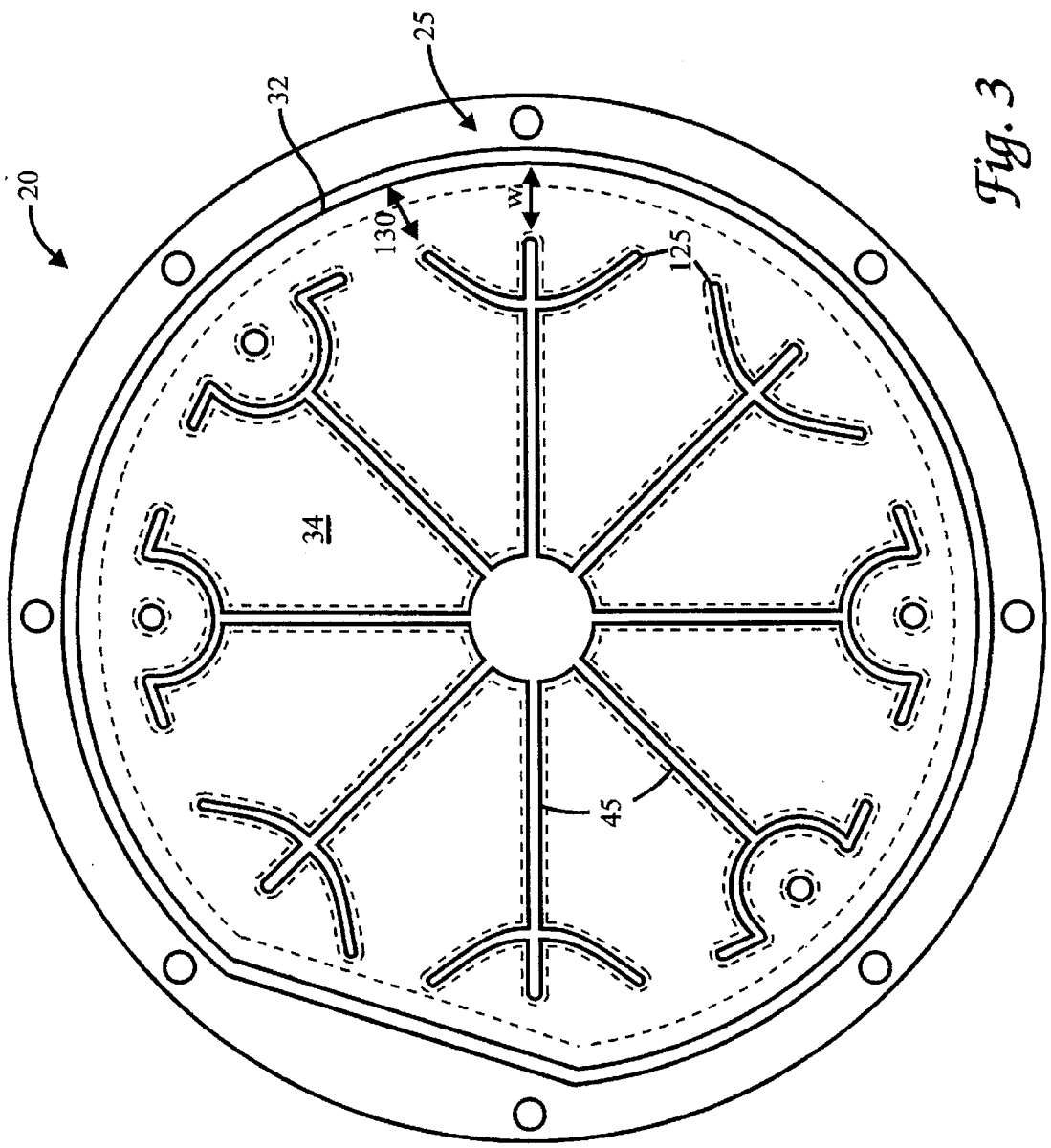
FIG. 3 is a top plan view of the chuck of FIG. 2.

The insulator 30 can comprise multiple layers 134, 136 adhering of commercially available insulative layers adhered to one another to form a multilayer laminate structure, as shown in FIGS. 2 and 3. The multiple insulator layers can comprise different materials to optimize the insulative and cooling groove 45 sealing properties of the insulator 30. For example, the upper insulator layer 136 can comprise a more elastic or cushioning layer that allows better sealing of the grooves 45. The lower layer 134 can comprise a more insulative layer to provide optimal electrical insolation of the electrode 35.

Typically, the grooves 45 are cut through the upper insulative layer 136 of the multilayer insulator by stamping, pressing, or punching the grooves through the upper insulative layer 136. The grooves are disposed in the upper insulative layer 136 so that the tips 125 of the grooves 45 extend close to a peripheral edge 32 of the insulator 30, as described above. Preferably the lower insulative layer 134 comprises two layers 134a and 134b. An electrically conductive layer, such as a metal layer, can be sandwiched between two lower insulative layers 134a, 134b to form the electrode 35 in the lower insulative layer 134. Typically, adhesives are used to adhere the insulative layers 134, 136 together, the adhesives including conventional pressure or temperature sensitive adhesives, such as polyamides. The assembled laminate member is then centered on, and adhered to the base 25 of the chuck 20. Methods of fabricating the laminate are generally described in the U.S. patent application Ser. No. 08/199,916, entitled "Electrostatic Chuck with Erosion-Resistant Electrode Connection," filed Feb. 22, 1994, by Shamouilian, et al.

Electrode

Typically, the electrode 35 is made out of an electrically conductive material, such as for example, metals such as copper, nickel, chromium, aluminum, iron, and alloys thereof.

Typically, the thickness of the electrode 35 is from about 0.5 μm to 100 μm, and more typically the thickness is from about 1 μm to 50 μm. The shape of the electrode 35 in the insulator 30 varies according to the size and shape of the substrate 40. For example, if the substrate 40 is disk shaped, the electrode 35 is also disk shaped to maximize the area of the electrode 35 in contact with the substrate 40. Preferably, the electrode 35 has an area of from about 200 to about 400 sq. cm and more preferably from about 250 to about 350 sq cm, and most preferably about 300 sq. cm.

The electrode 35 in the chuck 20 can be of several different configurations. In one configuration, the electrode 35 is a single continuous or patterned electrode, capable of operating as a unipolar electrode 35, as shown in FIGS. 1a and 2. FIGS. 1b, 4, and 5 show another electrode configuration in which the electrode 35 comprises at least two coplanar electrodes 210, 215 capable of use as bipolar electrodes 35a, 35b. The bipolar electrode 35a, 35b is advantageous because it allows the chuck 20 to be used in nonplasma processes, without electrically biasing the substrate 20. FIG. 4 shows a double ring bipolar electrode configuration comprising an inner circular electrode 35a and an outer electrode 35b which encircles and is spaced apart from the inner electrode 35a. FIG. 5 shows a different bipolar electrode configuration comprising two coplanar electrodes 35a, 35b having substantially equal size and substantially same shape. Alternative bipolar electrode configurations are disclosed in U.S. patent application Ser. No. 08/410,449, filed Mar. 24, 1995, by Shamouilian, et al., which is incorporated herein by reference. Because the grooves 45 on the upper insulative layer 136 of the insulator 30 do not cut through the electrodes 35a, 35b the chuck 20 is more adaptable to bipolar electrode configurations having pairs of electrodes.

Operation of the Chuck

Referring to FIG. 1a, a typical operation of the chuck 20 for holding a substrate 40 in a process chamber 50 is now described. To effect the process, the process chamber 50 is evacuated to a pressure ranging from about 1 to about 500 mTorr, and more typically from about 10 to about 100 mTorr. A semiconductor substrate 40, such as a silicon wafer, is transferred to the chamber 50 from a load lock transfer chamber (not shown), and placed on the electrostatic chuck 20 on a support 55 in the chamber 50. The first voltage supply 75 is activated to apply a voltage to the electrode 35 in the chuck 20, thereby electrically biasing the substrate 40. The resultant electrostatic force holds the substrate 40 to the chuck 20.

When the substrate 40 is placed on the chuck 20, the substrate 40 covers the upper insulative layer 136 of the insulator 30, and overhangs the collar ledge 150 of the base 25 of the chuck 20.

Process gas is introduced in the process chamber 50 using one or more sources of pressurized gas. The process gas can vary according to whether the substrate 40 is etched, or whether material is deposited on the substrate 40. For example, conventional halogen-containing etchant gases, such as for example, $Cl_2$, $BCl_3$, $CCl_4$, $SiCl_4$, $CF_4$, $NF_3$, and mixtures thereof, can be used to etch the substrate 40, as generally described in S. Wolf and R. N. Tauber, *Silicon Processing for the VLSI Era*, Vol. I, Chap. 16: Dry Etching for VLSI, Lattice Press, Sunset Beach, Calif. (1986), which is incorporated herein by reference.

For plasma processing, the second voltage supply 80 is then activated to electrically bias the support 55 with respect to the grounded surface 85, thereby forming a plasma from the process gas in the chamber 50, for etching the substrate 40.

During the process, the coolant source 105 provides the coolant, typically helium, to the cooling grooves 45 of the upper insulative layer 136. The flow of the coolant beneath the substrate 40 removes heat from the substrate 40 to maintain substantially uniform temperatures throughout the substrate 40 during its processing.

Electrostatic chucks having features of the present invention have several advantages. First, a larger actual electrode area is provided because the cooling grooves 45 are not through the electrode 35. This affords a greater clamping force for holding the substrate 40 on the chuck 20. Furthermore, since the grooves 45 do not cut through or otherwise interfere with the structure of the electrode 35, contiguous electrodes 35 can be provided, allowing greater adaptability for bipolar electrode configurations that use two electrodes 35a, 35b. The contiguous electrodes allow more uniform polarities to be established over the two electrodes 35a, 35b, which makes it easier to implement a bipolar electrode.

Further, because the grooves 45 do not cut through the electrode 35 and because a resilient and thick upper insulative layer 136 is provided over the electrode 35, the problem of coolant leak paths at the edges of the electrodes or at tips 125 of the grooves 45 is reduced. Thus, the grooves 45 may be extended to be very close to the edge of the chuck 20, providing greater temperature uniformity over the substrate 40 held to the chuck 20.

While the present invention has been described in considerable detail with reference to certain preferred versions, many other versions should be apparent to those skilled in the art. Therefore, the spirit and scope of the appended claims should not be limited to the description of the preferred versions contained herein.

What is claimed is:

1. An electrostatic chuck for holding a substrate having a center and a perimeter, the chuck comprising:
   (a) a base;
   (b) an insulator on the base, the insulator having (i) an electrode embedded therein, (ii) a top surface comprising cooling grooves for holding coolant therein, and (iii) a conformal, resilient, sealing edge between the tips of the cooling grooves and a peripheral edge of the insulator,
   wherein the sealing edge comprises a width w sized less than about 7 mm, and sized sufficiently small that the coolant in the tips of the grooves cools the perimeter of the substrate held on the chuck, and
   wherein the sealing edge is sufficiently thick that when a substrate is electrostatically held on the chuck and coolant is held in the cooling grooves, the sealing edge of the insulator resiliently conforms to the substrate so that substantially no coolant leaks out from the tips of the cooling grooves, and
   whereby during processing of a substrate held on the chuck, the coolant in the cooling grooves is capable of maintaining an average difference in temperatures between the center and perimeter of the substrate of less than about 10° C.

2. The electrostatic chuck of claim 1 wherein the width w of the edge gap is sized sufficiently small that the coolant in the groove maintains the perimeter of the substrate at temperatures less than about 100° C.

3. The electrostatic chuck of claim 1 wherein the cooling grooves form a pattern of intersecting grooves which extend radially across the top surface of the insulator.

4. The electrostatic chuck of claim 1 wherein the resilient insulator comprises polyimide.

5. The electrostatic chuck of claim 4 wherein the insulator has a tensile modulus of about 1 to 5 GPa.

6. The electrostatic chuck of claim 4 wherein the thickness of the insulator is from about 100 to 300 μm.

7. The electrostatic chuck of claim 1 wherein the insulator comprises (i) a lower insulative layer on the base, the lower insulative layer having the electrode embedded therein, and (ii) an upper insulative layer having the cooling grooves therein.

8. The electrostatic chuck of claim 7 wherein the thickness of the upper insulative layer is substantially equal to the thickness of the lower insulative layer.

9. The electrostatic chuck of claim 8 wherein the thickness of the upper insulative layer is at least about 50 μm.

10. The electrostatic chuck of claim 1 wherein the electrode in the insulator comprises at least two electrodes capable of being used as bipolar electrodes.

11. The electrostatic chuck of claim 10 wherein the two electrodes are coplanar and each electrode covers about half the area of the insulator.

12. The electrostatic chuck of claim 11 wherein each electrode comprises an area of at least 100 sq. cm.

13. An electrostatic chuck for holding a substrate in a chamber for processing of the substrate, the chuck comprising:
   (a) a base;
   (b) an insulator on the base, the insulator having a peripheral edge, the insulator comprising a (i) lower insulative layer having an electrode embedded therein, and (ii) an upper insulative layer having a thickness of at least about 50 micrometers, the upper insulative layer including cooling grooves therein for holding a coolant for cooling the substrate, the cooling grooves having the following characteristics:
      (1) the coolant grooves cut through substantially the entire upper insulative layer, and
      (2) the coolant grooves have tips close to the peripheral edge of the insulator that define a sealing edge having a width w sized less than about 7 mm, and sized sufficiently small that coolant in the grooves cools the perimeter of a substrate held on the chuck to maintain substantially the entire substrate at substantially constant temperatures during processing of the substrate, and
      (3) the coolant grooves do not cut through the electrode thereby allowing the electrode to cover substantially the entire area of the insulator.

14. The electrostatic chuck of claim 13 wherein the cooling grooves form a pattern of intersecting grooves which extend radially across the top surface of the insulator.

15. The electrostatic chuck of claim 13 wherein the insulator comprises polyimide.

16. The electrostatic chuck of claim 15 wherein the insulator has a tensile modulus of about 1 to about 5 GPa.

17. The electrostatic chuck of claim 13 wherein the thickness of the insulator is from about 100 to 300 µm.

18. The electrostatic chuck of claim 13 wherein the thickness of the lower insulative layer is substantially equal to the thickness of the upper insulator layer.

19. The electrostatic chuck of claim 13 wherein the electrode in the insulator comprises at least two electrodes capable of being used as bipolar electrodes.

20. An electrostatic chuck for holding a substrate having a center and a perimeter, the chuck comprising:

(a) a lower insulator layer having an electrode embedded therein, and (b) an upper insulator layer over the lower insulator layer, the upper insulator layer comprising (i) cooling grooves for holding coolant therein, the cooling grooves having tips close to a peripheral edge of the insulator layer, and (ii) a conforming, resilient, sealing edge between the tips of the cooling grooves and the peripheral edge of the insulator, the sealing edge characterized by:

(1) a width w sized less than about 7 mm, the width being sized sufficiently small that coolant held in the tips of the grooves cools the perimeter of the substrate held on the chuck, and (2) a thickness of at least about 50 micrometers, the thickness sized sufficiently large that when a substrate is electrostatically held on the chuck and coolant is held in the cooling grooves, the width w of the sealing edge of the insulator resiliently conforms to the substrate so that substantially no coolant leaks out from the tips of the cooling grooves, whereby during processing of the substrate, the coolant in the grooves is capable of maintaining an average difference in temperatures between the center and perimeter of the substrate of less than about 10° C.

21. The electrostatic chuck of claim 20 wherein the cooling grooves form a pattern of intersecting grooves which extend radially across the surface of the upper insulator layer.

22. The electrostatic chuck of claim 20 wherein the upper insulator layer comprises polyimide.

23. The electrostatic chuck of claim 20 wherein the upper insulator layer comprises a tensile modulus of about 1 to about 5 GPa.

24. The electrostatic chuck of claim 20 wherein the thickness of the combined lower and upper insulator layers is from about 100 to 300 µm.

25. The electrostatic chuck of claim 20 wherein the chuck further comprises a base for supporting the lower insulator layer.

26. The electrostatic chuck of claim 20 wherein the electrode in the lower insulator layer comprises at least two electrodes capable of being used as bipolar electrodes.

\* \* \* \* \*